United States Patent
Chang et al.

(10) Patent No.: US 9,076,652 B2
(45) Date of Patent: Jul. 7, 2015

(54) SEMICONDUCTOR PROCESS FOR MODIFYING SHAPE OF RECESS

(71) Applicant: UNITED MICROELECTRONICS CORP., Hsin-Chu (TW)

(72) Inventors: Ming-Hua Chang, Tainan (TW); Chun-Yuan Wu, Yun-Lin County (TW); Chin-Cheng Chien, Tainan (TW); Tien-Wei Yu, Kaohsiung (TW); Yu-Shu Lin, Pingtung County (TW); Szu-Hao Lai, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 25 days.

(21) Appl. No.: 13/902,870

(22) Filed: May 27, 2013

(65) Prior Publication Data

US 2014/0349467 A1  Nov. 27, 2014

(51) Int. Cl.
*H01L 21/20* (2006.01)
*H01L 21/02* (2006.01)

(52) U.S. Cl.
CPC ...... *H01L 21/0245* (2013.01); *H01L 21/02532* (2013.01); *H01L 21/0262* (2013.01); *H01L 21/02639* (2013.01)

(58) Field of Classification Search
None
See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |

(Continued)

OTHER PUBLICATIONS

Ichiro, Selective Epitaxial Growth of Si(Ge) for High Performance MOSFET Applications, ECS Trans. 2008, vol. 16, Issue 10, pp. 463-473., Oct. 14, 2008.

(Continued)

*Primary Examiner* — Scott B Geyer
(74) *Attorney, Agent, or Firm* — Winston Hsu; Scott Margo

(57) ABSTRACT

A semiconductor process includes the following steps. Two gates are formed on a substrate. A recess is formed in the substrate beside the gates. A surface modification process is performed on a surface of the recess to modify the shape of the recess and change the contents of the surface.

19 Claims, 4 Drawing Sheets

(56) References Cited

U.S. PATENT DOCUMENTS

| | | |
|---|---|---|
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,667,227 B2 | 2/2010 | Shimamune |
| 7,682,940 B2 | 3/2010 | Ye |
| 7,691,752 B2 | 4/2010 | Ranade |
| 7,838,370 B2 | 11/2010 | Mehta |
| 8,187,975 B1 | 5/2012 | Khare |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0093147 A1 | 4/2010 | Liao |
| 2012/0270382 A1* | 10/2012 | Lu et al. .................. 438/478 |

OTHER PUBLICATIONS

Yang et al., Title: Method of Making Strained Silicon Channel Semiconductor Structure, pending U.S. Appl. No. 13/274,357, filed Oct. 17, 2011.

* cited by examiner

SEMICONDUCTOR PROCESS FOR MODIFYING SHAPE OF RECESS

BACKGROUND OF THE INVENTION

1. Field of the Invention

The present invention relates generally to a semiconductor process, and more specifically to a semiconductor process which changes the contents of a surface of a recess.

2. Description of the Prior Art

For decades, chip manufacturers have been making metal-oxide-semiconductor (MOS) transistors faster by making them smaller. As semiconductor processes advance to very deep sub micron era such as 65-nm node or beyond, how to increase the driving current for MOS transistors has become a critical issue. In order to improve device performance, crystal strain technology has been developed. Crystal strain technology is becoming more and more attractive as a means for getting better performance in the field of MOS transistor fabrication. Putting a strain on a semiconductor crystal alters the speed at which charges move through that crystal. Strain makes MOS transistors work better by enabling electrical charges, such as electrons, to pass more easily through the silicon lattice of the gate channel. Attempts have been made to use a strained silicon layer, which has been grown epitaxially on a silicon substrate with a silicon germanium (SiGe) epitaxial structure or a silicon carbide (SiC) epitaxial structure disposed in between. In this type of MOS transistor, a biaxial compressive or tensile strain occurs in the epitaxy silicon layer due to the silicon germanium or silicon carbide which has a larger or smaller lattice constant than silicon; as a result, the band structure alters, and the carrier mobility increases. This enhances the speed performance of the MOS transistors.

As well as the type of epitaxial structure affecting the stresses induced in a gate channel of a MOS transistor, the shape of the epitaxial structure will affect the stresses also. Specifically, the shape of the epitaxial structure can control stresses induced in specific parts of the gate channel, to achieve or improve the electrical performances of the MOS transistor. However, the shapes of the epitaxial structures will change during later performed processes according to the processing situations such as processing temperatures, which will lead to the shapes of the epitaxial structures being different from predetermined shapes formed by etching. The quality of the formed MOS transistor is therefore hard to be controlled precisely.

SUMMARY OF THE INVENTION

The present invention provides a semiconductor process, which performs a surface modification process on a surface of a recess to control the shape of the recess and the contents of the surface.

The present invention provides a semiconductor process including the following steps. Two gates are formed on a substrate. A recess is formed in the substrate beside the gates. A surface modification process is performed on a surface of the recess to modify the shape of the recess and change the contents of the surface.

According to the above, the present invention provides a semiconductor process, which performs a surface modification process to modify the shape of a recess and change the contents of a surface of the recess. The original shape of the recess formed by etching may be changed by various processing environments of processes performed after the etching, and the original shape can be recovered by performing the surface modification process; the contents of the surface of the recess can also be changed to have contents of a later formed epitaxial structure thereon for improving bonding between them and reducing their interfacial defects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
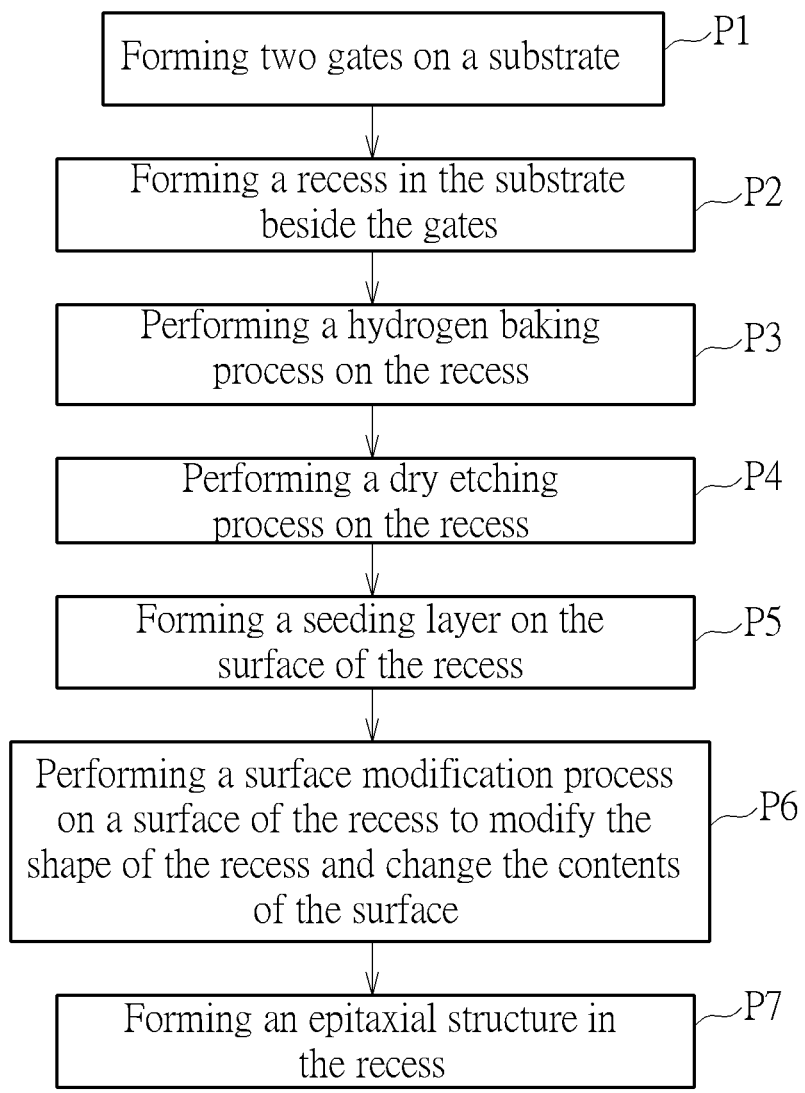
FIG. 1 schematically depicts a flow chart of a semiconductor process according to an embodiment of the present invention.

FIG. 1 schematically depicts a flow chart of a semiconductor process according to an embodiment of the present invention. FIGS. 2-7 schematically depict cross-sectional views of a semiconductor process according to an embodiment of the present invention. Please refer to FIG. 1 and FIGS. 2-7.

Figure 2:
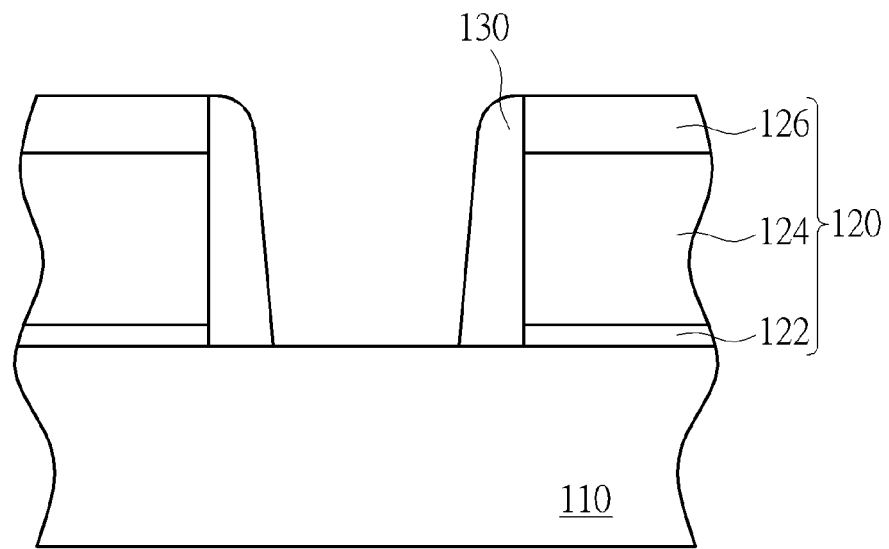
FIGS. 2-7 schematically depict cross-sectional views of a semiconductor process according to an embodiment of the present invention.

Please refer to the step P1 of FIG. 1, which illustrates forming two gates on a substrate. As shown in FIG. 2, a substrate 110 is provided, wherein the substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Two gates 120 are formed on the substrate 110. Each of the gates 120 may include a dielectric layer 122, an electrode layer 124 and a cap layer 126 stacked from bottom to top. More precisely, a dielectric layer (not shown), an electrode layer (not shown) and a cap layer (not shown) sequentially and entirely cover the substrate 110, and are then patterned to form the dielectric layer 122, the electrode layer 124 and the cap layer 126 stacked on the substrate 110. Two gates 120 are depicted in FIGS. 2-7, but the number of the gate 120 is not restricted to this. In another embodiment, the number of the gates 120 may be one or more than two, depending upon the requirements.

The present invention can be applied to a polysilicon gate process, a gate-first process, a gate-last for high-K first process, a gate-last for high-K last with a buffer layer first process or a gate-last for high-K last with a buffer layer last process. The dielectric layer 122 may include an oxide layer, a buffer layer or/and a dielectric layer having a high dielectric constant, but is not limited thereto. When the present invention is applied in a polysilicon gate process, the dielectric layer 122 is a dielectric suitable for a polysilicon gate such as an oxide layer; when the present invention is applied in a gate-first process or a gate-last for high-K first process, the dielectric layer 122 may include a buffer layer and a dielectric layer having a high dielectric constant; when the present invention is applied in a gate-last for high-K last with a buffer layer first process, the dielectric layer 122 may include a buffer layer and a sacrificial dielectric layer, wherein the sacrificial dielectric layer will be replaced by a dielectric layer having a high dielectric constant in a later performed metal gate replacement process; when the present invention is applied in a gate-last for high-K last with a buffer layer last process, the dielectric layer 122 may be a sacrificial dielectric layer, wherein the sacrificial dielectric layer will be replaced by a buffer layer and a dielectric layer having a high dielectric constant in a later performed metal gate replacement process.

The buffer layer may be an oxide layer, which may be formed through a chemical oxide process, a thermal oxide process, or other processes. The dielectric layer having a high dielectric constant may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST). The electrode layer 124 may be a polysilicon layer. The cap layer 126 may be a single layer or multilayer structure composed of nitride or oxide.

A spacer is formed on the substrate 110 beside the gate 120 to define the position of an epitaxial structure. The spacer 130 may be a single layer such as a silicon nitride layer or a silicon oxynitride layer etc, or a dual layer such as a silicon oxide/silicon nitride layer, but is not limited thereto. More precisely, the method of forming the spacer 130 may include the following. A spacer material is deposited on the gates 120 and the substrate 110 and then an etching process is performed to form the spacer 130. In this embodiment, the spacer 130 represents a spacer for defining and forming an epitaxial structure, thereby other spacers may be formed before/after the spacer 130 is formed to form a lightly doped source/drain region (as shown) or a source/drain region (as shown). For simplifying and clarifying the present invention, FIGS. 2-7 only depict the spacer 130 for forming an epitaxial structure.

Figure 3:
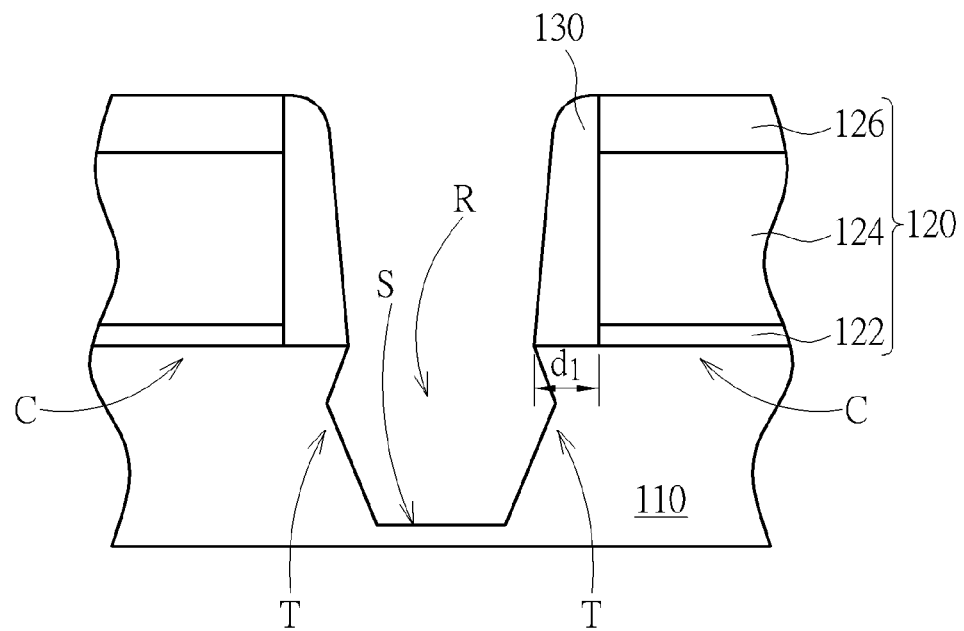

Please refer to the step P2 of FIG.1, which illustrates forming a recess in the substrate beside the gates. As shown in FIG.3, an etching process is performed to etch the exposed part of the substrate 110 so that a recess R is formed in the substrate 110. In one case, the etching process may include at least a dry etching step and at least a wet etching step. For example, the substrate 110 may be etched until a determined depth by a dry etching step and then may be laterally etched to form a desired profile of the recess R by a wet etching step, but is not limited thereto. The distance dl of the bottom of the spacer 130 contacting the substrate 110 affects the distance between the recess R and each of the gates 120. The distance between the recess R and each of the gates 120 is an important factor in affecting the stresses induced in a gate channel C. In this embodiment, the recess R has a hexagonal shaped cross-sectional profile, but is not limited thereto, as the cross-sectional profile of the recess R depends upon the specific requirements. Furthermore, the cross section of the recess R may have a polygonal shape, for example, a polygon having four or more sides, such as an octagon, hexagon, diamond, etc. The tips T of the recess R can increase partial stresses forced in specific parts of the gate channel C induced by a later formed epitaxial structure in the recess R. The partial stresses enhance the performance of the epitaxial structure and the tips T allow the partial stresses to be controlled easily, thereby improving the capability of the epitaxial structures. The stresses and their distribution in the gate channel C induced by the later formed epitaxial structure in the recess R can be controlled by adjusting the distance between the recess R and each of the gates and the shape of the recess R (including the number and the positions of the tips T).

A wet cleaning process (not shown) maybe selectively performed to clean the surface S of the recess R after the etching. The wet cleaning process may include a Dilute hydrofluoric acid (DHF) containing process, but it is not limited thereto.

Figure 4:
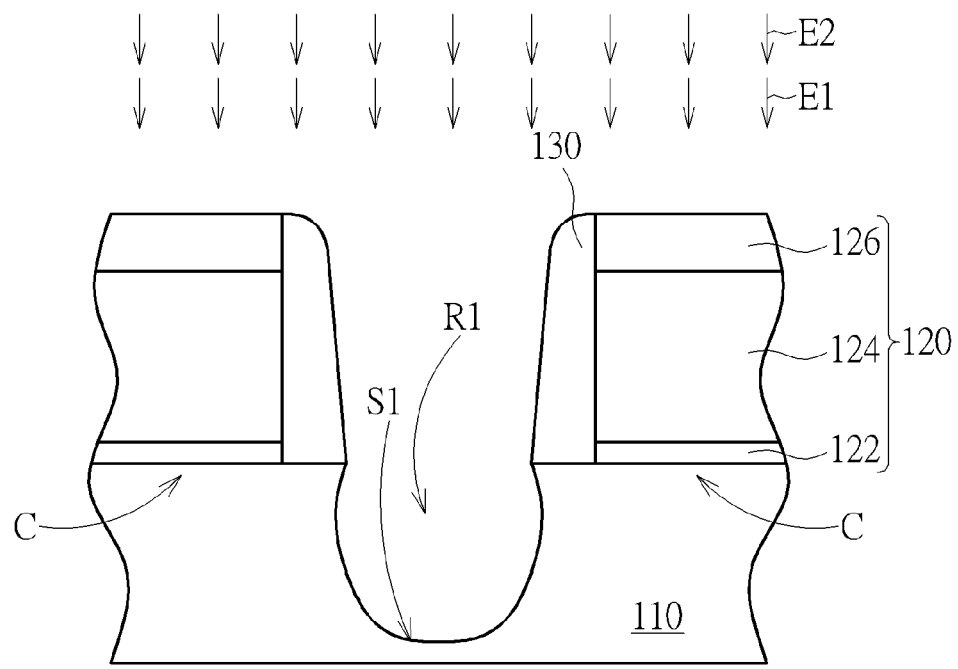

Please refer to the step P3 of FIG. 1, which illustrates performing a hydrogen baking process on the recess. A hydrogen baking process E1 may be selectively performed in the recess R to form a recess R1, as shown in FIG. 4. The purpose of performing the hydrogen baking process E1 is to clean the surface S1 of the recess R1 by volatilizing undesired impurities on the surface S1 of the recess R1; for example, impurities may include the residues remaining after the etching process for forming the recess R in the step of FIG. 3. In one case, the processing temperature of the hydrogen baking process E1 is 725° C. for removing undesired impurities effectively. However, the contents of the surface S of the recess R such as silicon will migrate due to this high processing temperature. As a result, the original shape of the recess R is changed; in particular, the tips of the recess R will be rounded, so that the recess R1 is formed with a smooth cross-sectional profile, which therefore degrades the partial stresses induced in the gate channel C.

Please refer now to the step P4 of FIG. 1, which illustrates performing a dry etching process on the recess. As shown in FIG. 4, an dry etching process E2 may be selectively performed in the recess R1. The dry etching process E2 can further clean the surface S1 of the recess R1 to remove residues on the surface S1 and repair surface defects in the surface S1. In a preferred embodiment, the dry etching process E2 may have hydrogen chloride gas or chlorine gas imported as etching gases, and hydrogen gas imported as a carrier gas, but it is not limited thereto. In another embodiment, the dry etching process E2 may have hydrogen fluoride (HF), fluorine (F2), hydrogen bromide (HBr), or bromine (Br2) as etching gases. In a preferred embodiment, the processing temperature of the dry etching process E2 is 600° C.~750° C. In a still preferred embodiment, the processing temperature of the dry etching process E2 is lower than 720° C. for having a sufficiently high temperature to clean residues on the surface S1 of the recess R1 effectively and repair defects in the surface S1, while reducing the rounding of the surface S1 as much as possible. Even more, the shape of the recess R may be slightly recovered by the back-etching of the dry etching process E2; that is, adjusting the processing temperature (such as 671° C.) and imported gases (such as using hydrogen chloride gas as an etching gas and hydrogen gas as a carrier gas). In this embodiment, the hydrogen baking process E1 is performed and then the dry etching process E2 is performed; in another embodiment, the hydrogen baking process E1 and the dry etching process E2 may be performed simultaneously, meaning the etching gas of the dry etching process E2 is imported while the hydrogen baking process E1 is performed.

Figure 5:
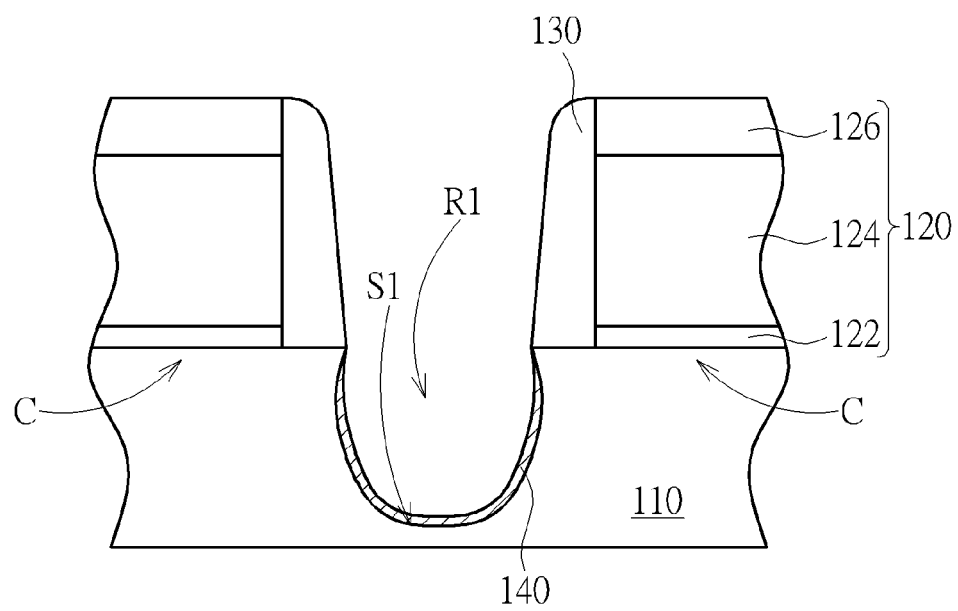

Please refer now to the step P5 of FIG. 1, which illustrates forming a seeding layer on the surface of the recess. As shown in FIG. 5, a seeding layer 140 is formed on the surface S1 of the recess R1. The seeding layer 140 may be a silicon layer formed on a silicon substrate 110, but it is not limited thereto. In one embodiment, the silicon layer may be formed by performing a deposition process wherein dichlorosilane (DCS) is the imported gas. Structural defects such as dislocation occur as the epitaxial structure being formed in the recess R can be reduced via forming the seeding layer 140 on the surface S1 of the recess R1. However, the seeding layer 140 forming process has a processing temperature as high as 735° C., so that the shape of the recess R1 will be rounded.

Figure 6:
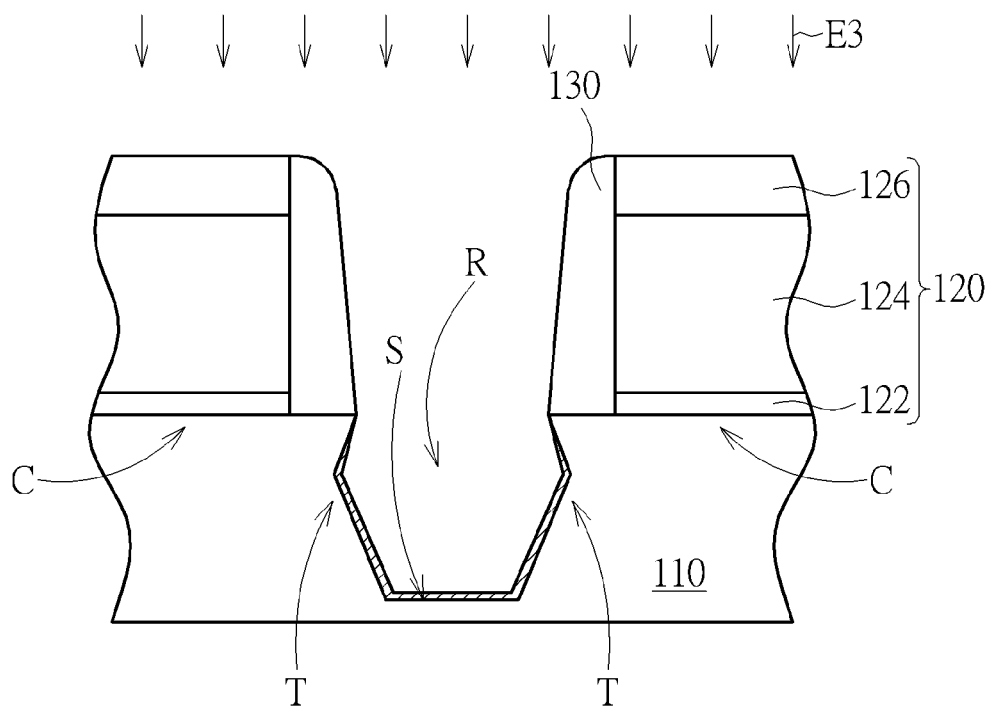

Please refer to the step P6 of FIG.1, which illustrates performing a surface modification process on a surface of the recess to modify the shape of the recess and change the contents of the surface. As shown in FIG.6, a surface modification process E3 is performed on the surface S1 of the recess R1, enabling the shape of the recess R1 to return to the shape of the recess R shown in FIG. 3, which has a hexagonal-shaped cross-sectional profile and has a plurality of perfect tips T for inducing partial stresses in the gate channel C by a later formed epitaxial structure therein. Furthermore, the cross section of the recess R may have a polygonal shape, for example, a polygon having four or more sides, such as an octagon, hexagon, diamond, etc. In this embodiment, the surface modification process is performed to recover the shape of the recess R from the shape of the recess R1; in other words, the surface modification process is performed to ensure that the shape of the recess R formed by etching will not be changed by processes performed after the etching, but it is not limited thereto. In another embodiment, the surface modification process E3 can be applied to change the shape of the recess R1 to another desired shape, enabling a formed transistor to achieve the desired electrical demands.

In this embodiment, the surface modification process is an etching and depositing synchronous process, meaning the surface S1 of the recess R1 is etched while a deposition process is performed. The etching is for recovering the shape of the recess R (or changing the shape of the recess R1 into another desired shape), and the deposition is for depositing desired ingredients into the surface S of the recess R, thereby changing the contents of the surface S. The aforesaid capabilities of the etching and the deposition may assist each other. Preferably, the etching rate of the etching and depositing synchronous process to the surface S1 is larger than the depositing rate to the surface S1, so layers will not be formed on the surface S1 of the recess R1 by the deposition of the surface modification process E3. In contrast, parts of the rounded surface S1 (especially for the tips) will be etched and the surface S1 will be repaired to recover the shape of the recess R from the shape of the recess R1. Thus, layers are preferably not formed on the recess R by the surface modification process E3.

More precisely, the etching and depositing synchronous process may have at least a depositing gas and at least an etching gas imported, to control the changing shape of the recess R1 and the concentration of the added contents in the surface S of the recess R through adjusting the ratio of the depositing gas and the etching gas during the process. In a preferred embodiment, the etching gas may include hydrogen chloride gas while the depositing gas may include germanium gas (or further include dichlorosilane gas), to pair with a silicon germanium epitaxial structure formed in the recess R later. For instance, the ratio of germanium gas: dichlorosilane gas: hydrogen chloride gas may be from 1:1:1 to 0:1:1. In this way, rounded parts of the surface S1 can be etched by hydrogen chloride gas while germanium is deposited into the surface S1, so the contents in the surface S1 can be changed to include germanium for buffering the surface S1 and a later formed silicon germanium epitaxial structure. In another embodiment, the etching gas may have hydrogen fluoride (HF), fluorine (F2), hydrogen bromide (HBr), bromine (Br2) for etching the silicon. The surface modification process E3 may further have hydrogen gas imported as a carrier gas to control the total pressure of gases imported in the process, and adjust the processing velocity and the uniformity of the etching and deposition. In a preferred embodiment, the processing temperature of the surface modification process E3 is 600° C.~750° C., so the processing velocity can be maintained to change the contents effectively without affecting the shape of the recess R, but this is not limited thereto.

As the seeding layer 140 is formed by importing dichlorosilane gas in a deposition process, as mentioned above, the surface modification process E3 can be performed in-situ in the same processing chamber by further importing hydrogen chloride gas and germanium gas. That is, the seeding layer 140 is preferably formed in the same processing chamber as the surface modification process E3 to enhance processing efficiency. Still preferably, the seeding layer 140 is formed by importing different gases into the same processing chamber as the surface modification process E3 is performed.

Figure 7:
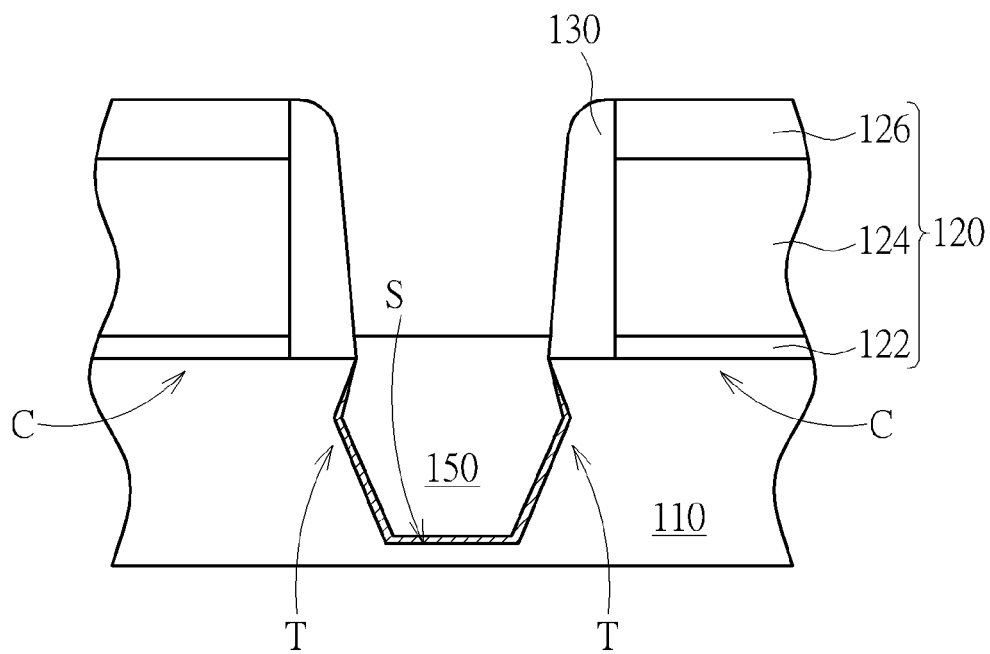

Please refer to the step P7 of FIG. 1, which illustrates forming an epitaxial structure in the recess. As shown in FIG. 7, an epitaxial structure 150 is formed in the recess R. In this embodiment, the epitaxial structure 150 is a silicon germanium epitaxial structure, which is preferably paired with the surface modification process E3 having germanium gas imported. This enables the surface S of the recess R including germanium (as mentioned before) to bond with the epitaxial structure 150 more easily so that surface defects will be decreased. In another embodiment of forming another epitaxial structure such as forming a silicon carbide epitaxial structure or a silicon phosphorous epitaxial structure, the depositing gas is preferably common to at least one of the composition of the epitaxial structure, therefore assisting the formation of the epitaxial structure. Moreover, the epitaxial structure 150 may include a multilayer or a surrounded structure having a different germanium concentration changing from internal to external or/and from bottom to top by adjusting different concentrations of the imported germanium gas. The ingredients are not restricted to germanium. Thereafter, semiconductor processes such as a metal gate replacement process may be performed.

To summarize, the present invention provides a semiconductor process, which performs a surface modification process to modify the shape of a recess and change the contents of a surface of the recess. As the original shape of the recess formed by etching may be changed by various processing environments of processes performed after the etching, the original shape can be recovered by performing the surface modification process. The contents of the surface of the recess can be changed to have contents of a later formed epitaxial structure thereon for improving bonding and reducing interfacial defects. The contents changed by the surface modification process may be different, according to various purposes.

In a preferred embodiment, the surface modification process is an etching and depositing synchronous process, which imports at least a depositing gas and at least an etching gas, and the ratio of the depositing gas and the etching gas may be adjusted during the process to control the shape of the recess and the contents of the surface of the recess. For instance, dichlorosilane gas may be imported in a processing chamber to form a seeding layer covering the surface of the recess; germanium gas may be used as a deposition gas while hydrogen chloride gas may be used as an etching gas for performing the surface modification process. A silicon germanium epitaxial structure is then formed into the recess. The seeding layer will thereby be formed in the same processing chamber as that in which the surface modification process is performed, for enhancing the processing velocity. Since the surface of the recess includes germanium ingredient from importing germanium gas while performing the surface modification process, the epitaxial structure can be grown with decreased surface defects and improved interfacial bonds in comparison with the prior art. The reliability of a formed semiconductor component is thereby increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   forming a gate on a substrate;
   forming a recess in the substrate beside the gate;
   performing a surface modification process on a surface of the recess to modify the shape of the recess and change the contents of the surface; and
   forming a seeding layer on the surface of the recess before the surface modification process is performed.

2. The semiconductor process according to claim 1, further comprising:
   forming an epitaxial structure in the recess after the surface modification process is performed.

3. The semiconductor process according to claim 2, wherein the epitaxial structure comprises a silicon germanium epitaxial structure.

4. The semiconductor process according to claim 1, wherein the surface modification process comprises an etching and depositing synchronous process.

5. The semiconductor process according to claim 4, wherein the etching rate of the etching and depositing synchronous process to the surface is larger than the depositing rate of the etching and depositing synchronous process to the surface.

6. The semiconductor process according to claim 4, wherein the etching and depositing synchronous process comprises importing at least a depositing gas and at least an etching gas.

7. The semiconductor process according to claim 6, further comprising:
   forming an epitaxial structure in the recess after the surface modification process is performed, wherein the depositing gas is common to one of the elements that make up the composition of the epitaxial structure.

8. The semiconductor process according to claim 6, wherein the etching and depositing synchronous process has germanium gas and hydrogen chloride gas imported.

9. The semiconductor process according to claim 8, wherein the ratio of the germanium gas to the hydrogen chloride gas is adjusted as the etching and depositing synchronous process is performed for controlling the shape of the recess.

10. The semiconductor process according to claim 4, wherein the etching and depositing synchronous process further has dichlorosilane gas imported.

11. The semiconductor process according to claim 4, wherein the processing temperature of the etching and depositing synchronous process is in a range from 600° C.~750° C.

12. The semiconductor process according to claim 1, wherein the seeding layer is formed in the same processing chamber as that in which the surface modification process is performed.

13. The semiconductor process according to claim 12, wherein gases imported as the seeding layer is formed are different from gases imported as the surface modification process is performed.

14. The semiconductor process according to claim 12, wherein the seeding layer comprises a silicon layer.

15. The semiconductor process according to claim 1, further comprising:
   performing a hydrogen baking process on the recess before the surface modification process is performed.

16. The semiconductor process according to claim 15, further comprising:
   performing an etching process on the recess after the hydrogen baking process is performed.

17. The semiconductor process according to claim 16, wherein the etching process comprises importing hydrogen chloride gas or chlorine gas.

18. The semiconductor process according to claim 16, wherein the processing temperature of the etching process is lower than 720° C.

19. The semiconductor process according to claim 1, wherein the recess has a hexagonal shaped cross-sectional profile.

* * * * *